United States Patent [19]

Bolyn

[11] Patent Number: 5,761,703

[45] Date of Patent: Jun. 2, 1998

[54] APPARATUS AND METHOD FOR DYNAMIC MEMORY REFRESH

[75] Inventor: Philip C. Bolyn, Norristown, Pa.

[73] Assignee: Unisys Corporation, Blue Bell, Pa.

[21] Appl. No.: 698,843

[22] Filed: Aug. 16, 1996

[51] Int. Cl.⁶ .................................................. G06F 12/00
[52] U.S. Cl. .................................. 711/106; 711/163
[58] Field of Search .......................... 365/222; 395/431, 395/432, 433, 490; 711/104, 105, 106, 163

[56] References Cited

U.S. PATENT DOCUMENTS

| | | | |
|---|---|---|---|
| 4,887,240 | 12/1989 | Garverick et al. | 365/222 |
| 5,148,546 | 9/1992 | Blodgett | 395/750 |
| 5,193,165 | 3/1993 | Eikill et al. | 365/222 |
| 5,321,661 | 6/1994 | Iwakiri et al. | 365/222 |
| 5,469,559 | 11/1995 | Parks et al. | 395/433 |
| 5,524,248 | 6/1996 | Parks et al. | 395/750 |
| 5,537,564 | 7/1996 | Hazanchuk et al. | 395/427 |
| 5,644,545 | 7/1997 | Fisch | 365/222 |

Primary Examiner—Tod R. Swann
Assistant Examiner—Conley B. King, Jr.
Attorney, Agent, or Firm—John B. Sowell, Esq.; Mark T. Starr, Esq.

[57] ABSTRACT

A dynamic memory refresh apparatus includes a programmable refresh interval generator that generates an interval for generating a refresh request signal. The refresh interval time is based on the manufacturer specified DRAM cycle time, the system clock period, and the number of memory segments on the memory board that are supported by the computer system. The refresh interval time substantially maximizes the time between refreshes of a particular DRAM module. The dynamic refresh apparatus also includes a memory segment pointer generator that generates a memory segment pointer. The memory segment pointer points to the next memory segment to be refreshed. The memory segment pointer is generated such that the memory segments are selected in a staggered manner. In addition, the dynamic memory refresh apparatus includes a refresh request generator that generates a refresh request signal for the memory segment pointed to by the memory segment pointer. The refresh request generator generates the refresh request only for segments for which data is present.

15 Claims, 8 Drawing Sheets

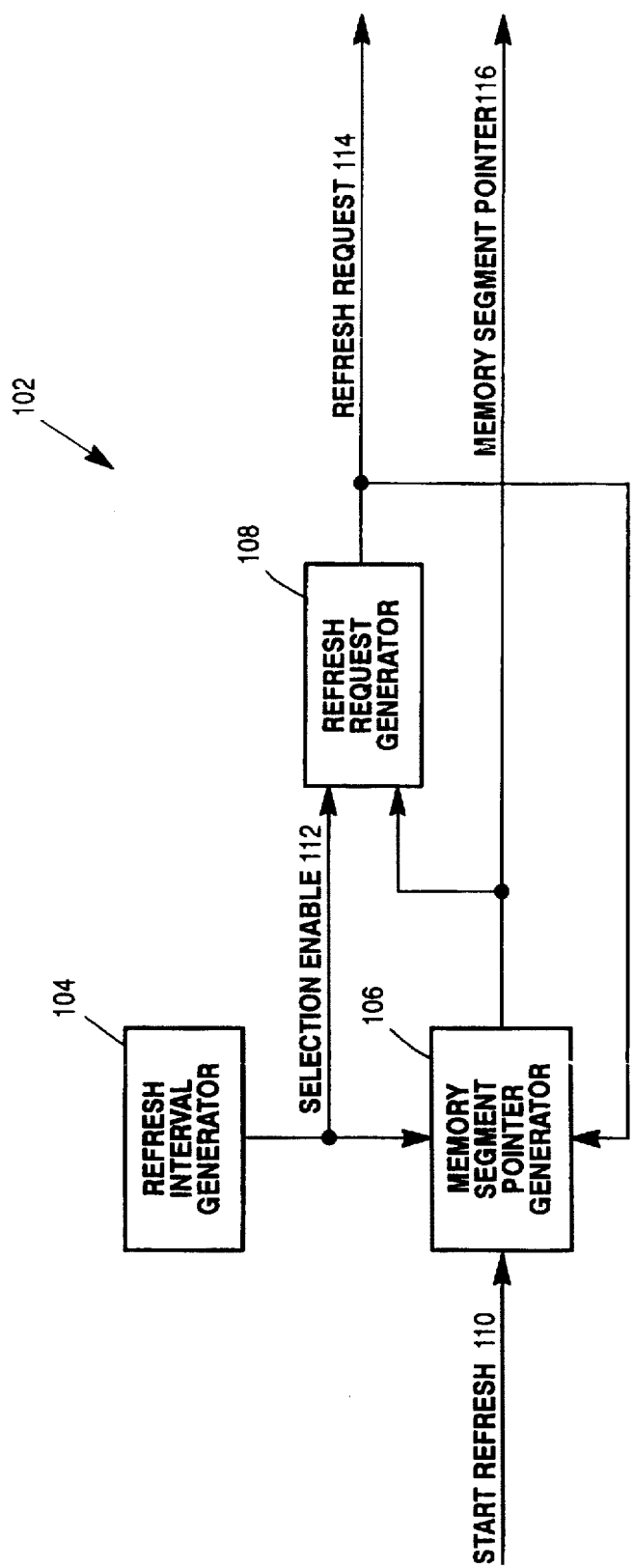

APPARATUS AND METHOD FOR DYNAMIC MEMORY REFRESH

BACKGROUND OF THE INVENTION

1. Field of the Invention

The present invention relates generally to dynamic memory refresh systems. More specifically, the present invention relates to an efficient dynamic memory refresher that eliminates unnecessary refreshes with a reduced amount of overhead.

2. Related Art

Memory in modern computer systems is generally supplied using memory modules. The memory modules are typically random access memory (RAM) modules. The RAM modules are placed in sockets on memory boards. Typically, each socket corresponds with one memory segment. Computer systems are typically designed to address a maximum number of memory segments. The maximum number of memory segments is fixed for each particular embodiment of a computer system. This is true regardless of whether or not a socket is present on the memory board for each segment, or whether or not a particular socket on a memory board is populated with a memory module. This fixed maximum number of memory segments is referred to herein simply as the 'number of segments'. Thus, each computer system described in the examples below comprise a fixed number of memory segments.

The term module refers to the actual memory device that populates a memory socket on a memory board, thereby activating a particular memory segment. Actually, in some implementations multiple modules may comprise a particular memory segment, but for simplicity, a one to one correspondence between memory modules and memory segments is assumed. The memory boards are housed in memory subsystems. The memory subsystems are accessed by other components of the computer system, such as the central processing units (CPUs) and the like.

There are two broad categories of RAM, static random access memory (SRAM), and dynamic random access memory (DRAM). SRAM has two primary advantages over DRAM. First, it generally provides faster data access than DRAM. Second, SRAM stores data permanently (as long as power is supplied to the SRAM module). However, SRAM is significantly more expensive and takes up more space than DRAM. Therefore, DRAM modules are usually used where large quantities of RAM are required in a computer system.

A primary problem with DRAM is that is does not store data permanently. Rather, DRAM has to be refreshed. This is because DRAM stores data as a charge on a capacitor. Over time, the charge leaks out of the capacitor. Without a refresh mechanism, data stored in a DRAM is lost. Refresh mechanisms read the contents of a DRAM memory location and restore the data, thereby refreshing the charge on the capacitor. The refresh must occur prior to the time the capacitor discharges. Discharge times are provided by the DRAM manufacturer's specifications.

Refresh is accomplished by accessing the data within each cell in a DRAM. DRAM modules are generally organized in a matrix having rows and columns. In order to effectively perform refresh operations without taking an inordinate amount of time by continuously reading and writing to each cell every couple of milliseconds, DRAMs are organized so that an entire row may be refreshed during a single operation. This feature dramatically decreases the amount of time spent on refresh cycles.

However, there is still significant overhead associated with performing DRAM refreshes. First, reads and writes to and from DRAMs cannot take place while a DRAM is being refreshed, which typically takes multiple clock cycles to perform. Thus, a computer system will incur a performance penalty of undesired wait states if a memory read or write request is active during a refresh sequence. Due to the devastating effect of memory loss which would occur if a refresh is not immediately processed when a request is generated, such requests typically have higher priorities than memory read or write requests.

In addition, the DRAM refresh sequence causes a current drain on the computer system. This is especially true when large numbers of DRAMs are refreshed simultaneously. Thus, computer systems are typically designed so that DRAM segments are refreshed in a serial fashion. That is, the DRAM refresh is 'staggered' such that only one or a few DRAM modules are refreshed at any particular time.

Many conventional computer systems perform refresh cycles on each memory segment, regardless of whether or not the memory segment is actually populated. This is true even though generating such unnecessary refresh cycles brings about the same undesired performance and power penalties as does the necessary refresh cycles. Still, many conventional computer systems function in this fashion due to the additional overhead necessary, and the complications that arise with the use of complex logic and control circuitry that is designed to overcome this problem (see below).

Another approach used by conventional computer systems to overcome this problem is to modify the behavior of the refresh controller(s) based on a determination of whether or not particular memory segments are populated. For example, in some computer systems a determination is made during system initialization time, as to which memory segments are populated and which ones are not. Once this fact is determined, the unpopulated memory segments are tagged so that unnecessary refresh cycles are not generated for the tagged segments. However, this method results in additional logic and/or control circuitry that is used to determine which memory segments are populated. Further, additional overhead is required to tag the populated memory segments. Additionally, overhead is required to determine a new refresh interval by the refresh generated that is based on the number of memory segments that are populated. All the preceding overhead adds to the system initialization time and is expensive in terms of system programming and support circuitry.

As stated this determination usually occurs each time the system is initialized. Alternatively, the determination of memory configuration can be made at the time the memory configuration changes. In this case, the user typically is required to initiate a program that indicates to the computer system that such changes have been made. The program then performs the function of determining which memory segments are populated, as described above. However, this method not only puts an additional burden upon the user, but it also requires non-volatile memory on the system board which is used to store the results of the new memory configuration.

SUMMARY OF THE INVENTION

Accordingly, the present invention is directed towards a method and apparatus for refreshing dynamic memory modules that eliminates unnecessary refresh cycles to thereby decrease the power consumption and increase the performance of conventional computer systems. In addition the present invention achieves such unnecessary refresh cycles without the need for the conventional overhead associated with the elimination of such unnecessary refresh cycles. That is, the present invention eliminates the need for altering the refresh interval based on the number of populated memory segments.

The method and apparatus of the present invention provide a means for programming a fixed refresh interval that is independent of the number of memory segments that are populated with memory modules. Once a refresh interval is determined for a particular implementation of a computer system, that number remains constant. The refresh interval is based on parameters that typically do not change for a particular system design, namely the number of segments supported by the computer system, the frequency of the system clock, and the DRAM refresh period (typically noted as '$T_{REF}$' in DRAM manufacturer specifications).

The dynamic memory refresh apparatus includes a refresh interval generator that generates an interval for generating a refresh request signal. As stated the refresh interval is based on the manufacturer specified DRAM refresh period, the system clock period, and the number of memory segments supported by the specific implementation of the computer system. The dynamic refresh apparatus also includes a memory segment pointer generator that generates a memory segment pointer. The memory segment pointer points to the next memory segment to be refreshed. The memory segment request pointer is generated such that the memory segments are selected in a staggered manner. In addition, the dynamic memory refresh apparatus includes a refresh request generator that generates a refresh request signal for the memory segment pointed to by the memory segment pointer. Unlike conventional refresh generators, the refresh request generator of the present invention generates refresh request signals only for segments that are populated with memory modules.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the digit(s) to the left of the two rightmost digits in the corresponding reference number.

BRIEF DESCRIPTION OF THE FIGURES

The present invention will be described with reference to the accompanying drawings, wherein:

FIG. 1 is a dynamic refresh system according to a preferred embodiment of the present invention.

DETAILED DESCRIPTION OF THE PREFERRED EMBODIMENTS

Figure 2B:
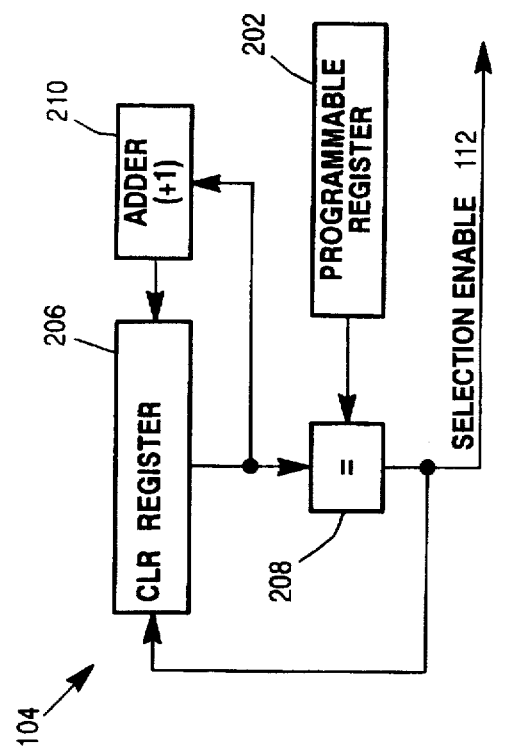
FIGS. 2A-B are refresh interval generators for use in the preferred embodiment.

The present invention is directed towards a refresh generator that provides request signals used for refreshing DRAM modules. The DRAM modules populate memory segments located on memory boards in a computer system. The present invention provides advantages over conventional DRAM refresh systems. First, the present invention eliminates unnecessary refresh cycles. This feature of the present invention decreases the overall power consumption of the computer system and increases the memory access performance. Second, the present invention eliminates unnecessary refresh cycles without the overhead conventionally associated with the elimination of such refresh cycles, such as increased system initialization time caused by the determination of a refresh interval based on the population of memory segments.

The present invention provides a means for programming a fixed refresh interval that is independent of the population status of the memory segments. Once a refresh interval is determined for a particular implementation of a computer system, it remains constant. The refresh interval is based on parameters that typically do not change for a particular implementation, namely the number of segments addressed, the frequency of the system clock, and the DRAM refresh period.

Additionally, the present invention provides a programmable refresh interval that can be changed when desired, for example, in new system designs having more or less memory segments, different system clock frequencies, and/or DRAM module changes having different DRAM refresh periods. Thus, an embodiment of the present invention can be used with a variety of computer system boards.

FIG. 1 illustrates a dynamic refresh system 102 according to a preferred embodiment of the present invention. The dynamic refresh system 102 includes a programmable refresh interval generator 104, a memory segment pointer generator 106, and a refresh request generator 108. The refresh interval generator 104 indicates whether the required refresh period has elapsed. The memory segment pointer generator 106 generates a memory segment pointer 116. The memory segment pointer 116 indicates the memory segment for which a refresh request is generated. The memory segment pointer generator 106 also provides logic to account for the possibility of latency between the time a refresh request 114 is generated and the time a refresh sequence begins. The start refresh signal 110 indicates that a refresh sequence has started. Using the refresh request signal 114, the memory segment pointer generator 106 prevents the memory segment pointer 116 value from changing prior to the start of a refresh sequence. The refresh request generator 108 generates a refresh request 114 for the particular memory segment pointed to by the memory refresh pointer 116. No refresh request 114 is generated, however, if a DRAM module is not present in the memory segment pointed to by the memory segment pointer 116.

Figure 2A:
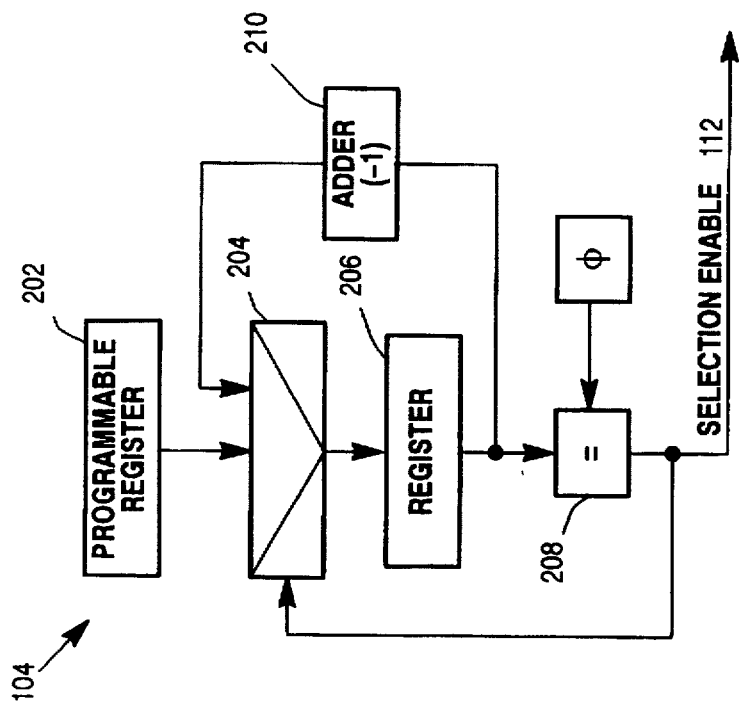

FIG. 2A illustrates a refresh interval generator 104 according to a preferred embodiment of the present invention. Referring to FIG. 2A, the refresh interval generator includes a programmable register 202, a multiplexer 204, a register 206, an adder 210, and a comparator 208. The refresh interval generator 104 outputs a selection enable signal 112.

The refresh interval generator 104 establishes the interval of time between refreshes of DRAM modules. One criterion of the present invention is that the interval between refresh cycles for a particular DRAM module be as long as possible. The maximum interval time, however, is constrained by the DRAM module refresh period. The DRAM module refresh period is the maximum amount of time that can elapse between refresh cycles for a particular DRAM row. As stated, this value ($T_{REF}$) is obtained from specifications published by the manufacturer of the DRAM module. As is well known, the interval between DRAM module refreshes cannot be greater than the maximum allowable DRAM module refresh time without risking data loss due to discharge of charge from the capacitors that form the DRAM module. Thus, the refresh interval generator 104 must indicate when the maximum allowable time has passed since the last DRAM module refresh.

In the preferred embodiment, a representation of the maximum interval time is stored in the programmable register 202. The programmable register 202 makes the refresh interval generator 104 programmable so that it can be used in a variety of systems without making hardware changes. The value stored in the programmable register 202 is calculated according to the following equation:

$$\frac{\text{DRAM row refresh period}}{\text{System clock period}} \times \frac{1}{\text{Number of segments}} \quad (1)$$

where the DRAM refresh row period interval is specified by the DRAM module manufacturer (see below), the system clock cycle time is the period of the computer system's clock (i.e., the clock that drives the circuit illustrated in the refresh interval generator), and the number of segments is the number of segments addressed by the particular implementation of the computer system. The value calculated in Equation (1) is not the actual representation of the refresh time. Rather it corresponds to the value of the refresh time spread over the number of rows in each DRAM segment and the number of segments that are supported by the memory board. This allows the present invention to stagger DRAM module refreshes.

The DRAM row refresh period is the refresh period as specified by the DRAM manufacture (i.e. $T_{REF}$), divided by the number of DRAM rows, which is also specified by the DRAM manufacturer. For example, suppose for a particular DRAM that is to be used in a computer system, the values are as follows: $T_{REF}$ = 64 ms, and the number of DRAM rows=4096. Thus the DRAM Row refresh period is:

$$\frac{64 \text{ ms}}{4096} = 15.625 \text{ μs}$$

Further, suppose that the number of segments for a particular computer system is 16 and the system clock period is 20ηs. Thus, referring back to equation (1) and inserting the values in this example, the refresh interval is:

$$\frac{15.625 \text{ μs}}{20 \text{ ηs}} \times \frac{1}{16} = 48.828125 \quad (2)$$

In the preferred embodiment, the programmable register 202 is an integer register. As a result, the value resulting from equation (1) may have to be rounded. In this example, the result of equation (2), must be rounded down to the nearest integer to assure that refreshes will occur on time. Thus, the value programmed into register 202 is 48.

Referring back to Equation (1), the number of segments corresponds to the maximum number segments supported by the memory board. For example, if there are 16 segments on the memory board, the number of segments is 16, even though only 4 segments may be populated in a specific configuration. Further, the number of segments is 16 even if a particular embodiment provides less than 16 sockets thereby reducing the practical memory expansion capabilities of the computer system. As stated, the number of segments as used herein is constrained by the addressing capabilities dictated by the system design of a particular memory board and memory controller.

The dynamic refresh system of the present invention cycles through attempts to refresh every segment on the memory board, even if there is no DRAM module present in a particular segment. If a DRAM module is not present in a particular segment, no refresh request 114 is generated for the segment. A DRAM module is present in a particular memory segment if it populates the memory segment and both the memory segment and DRAM module are operable.

Referring back to FIG. 2A, a multiplexer 204 selects either the value in the programmable register 202 or the result of an adder 210. The multiplexer 204 selects the value of the programmable register 202 at system initialization and resets the register 206 to restart counting the refresh interval (i.e., reset the refresh interval). The multiplexer 204 selects the result of the adder 210 to continue the countdown when counting off the time of a refresh interval. In the preferred embodiment, the refresh interval generator 104 determines the elapse of the refresh interval by counting down to zero from the value in the programmable register. In an alternative embodiment (described with reference to FIG. 2B), the refresh interval generator 104 counts up to the value stored in the programmable register 104 (from zero) to determine the elapse of the refresh interval.

The adder 210 decrements the value in the register 206. In the preferred embodiment, the adder performs the decrement by adding an increment value of negative one. The decremented value is stored back in the register 206. This process continues until the value in the register 206 equals zero. When the value in the register 206 equal zero, the comparator asserts a selection enable signal 112. The selection enable signal 112 is one input to the memory segment pointer generator 106 to determine whether the memory segment pointer 116 is updated. The selection enable signal 112 is also input to the refresh request generator 108 to determine whether a refresh signal is for a particular segment pointed to by the memory segment pointer 116. The selection enable signal 112 also controls the state of the multiplexer 204. When the comparator 208 asserts the selection enable signal 112, the selection enable signal causes the multiplexer to select the value in the programmable register 202 to be loaded into the register 206. That is, the refresh interval generator 104 is reset to begin the count for the next refresh interval.

FIG. 2B illustrates an alternative embodiment of the refresh generator 104. The refresh interval generator in FIG. 2B uses similar components as that illustrated in FIG. 2A. In FIG. 2B, however, the refresh interval generator 104 counts from zero to the value of the register stored in the programmable register 202 (calculated according to Equation (1)). Thus, the value in the register 206 is initialized to zero at system startup or at the end of a refresh interval. The value stored in the register 206 is compared to the value of the programmable register 202. If they are equal, indicating that a refresh interval has elapsed, the comparator asserts a selection enable signal 112 and clears the register 206 (i.e., resets it to zero). If they are not equal, the value stored in the register 206 is incremented. In the preferred embodiment, the adder performs the increment by adding one. The incremented value is stored back into the register 206.

Thus, the circuit illustrated in FIG. 2B performs the function required by the refresh interval generator 104 without requiring a multiplexer. It would be apparent to those skilled in the art that the circuits illustrated in FIGS. 2A and 2B, represent only a few of the many ways in which the desired functionality of the refresh interval generator 104 can be performed.

Figure 3:
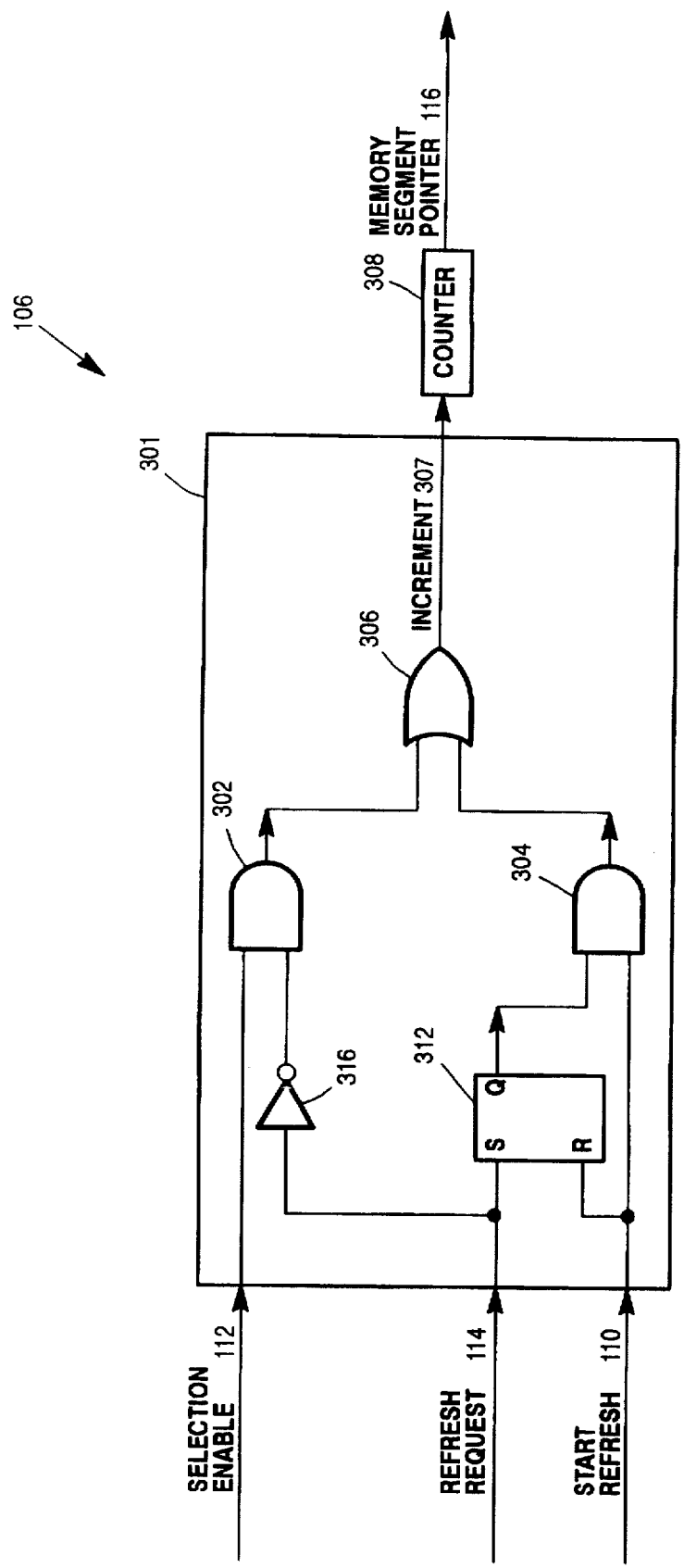
FIG. 3 is memory segment pointer according to the preferred embodiment.

FIG. 3 illustrates a memory segment pointer generator 106. Referring to FIG. 3, the memory segment pointer generator comprises control logic 301 and a counter 308. The memory segment pointer generator 106 inputs the selection enable signal 112 generated by the refresh interval generator 104, the refresh request signal 114 generated by the refresh request generator 108, and a start refresh signal 110 (described below). The memory segment pointer generator 106 outputs a memory segment pointer signal 116. The memory segment pointer 116 points to the next memory segment that is to be refreshed.

In the preferred embodiment, the count value of the counter 308 is a pointer to one of the segments on the memory board. In addition, in the preferred embodiment, the counter is a modulo-N counter, where N is the number of segments on the memory board. Thus, if the memory board has 16 modules, the counter 308 is a modulo-16 counter. Using a modulo N counter enables the present invention to cycle the memory segment pointer 116 to point to each of the memory segments on the memory board, in a sequential manner, as the counter is incremented.

Because the memory segment pointer 116 points to each segment on the memory board in turn during the refresh interval, the dynamic refresh of the present invention is staggered. Only one DRAM module on a particular memory board is refreshed at a time. This minimizes the current drain due to the refresh sequence, and therefore the power consumption requirements, on the system.

The control logic 301 generates an increment signal 307 to the counter 308. The control logic 301 generates the increment signal 307 if either of the following two conditions is satisfied. First, the control logic 301 generates an increment signal 307 if a refresh interval has elapsed (i.e., refresh interval generator 104 asserted the selection enable 112 signal) and no refresh was requested (i.e., the refresh request generator 108 did not assert the refresh request signal 114). The first condition is tested by AND gate 302. Second, the control logic 301 generates an increment signal 307 if a refresh request has been made (i.e., the refresh request generator 108 asserted the refresh request signal 114) and a refresh sequence has been started (i.e., system logic (not shown) generates a start refresh signal 110). An AND gate 304 tests for the second condition. OR gate 306 asserts the increment signal, causing the counter to increment, if either of the first or second conditions is satisfied.

Because there can be latency between assertion of a request refresh command and the start of the refresh sequence, the present invention provides a counter increment inhibit mechanism for ensuring that the counter does not increment until the refresh sequence has begun. Without such an inhibit mechanism, the counter could increment prior to the start of a refresh sequence. In such a case, the memory segment pointer 116 (the counter 308 count value) would point to the wrong memory segment. An ensuing refresh sequence would then refresh the wrong segment. In such a case, a vital refresh sequence could be missed, resulting in data loss.

In the preferred embodiment, the inhibit mechanism is a set-reset (SR) flip-flop 312. SR flip-flops are well-known in the art. The flip-flip 312 ensures that the counter 308 is not incremented until the refresh sequence for the segment pointed to by the memory segment pointer 116 has been started. The flip-flop 312 is set when the refresh request generator 108 asserts the refresh request signal 114. However, the counter 307 cannot increment until the start refresh signal 110 is asserted. The flip-flop 307 resets on the clock cycle after the start refresh signal 110 is asserted. Thus, the AND 304 is asserted for one clock cycle after assertion of the start refresh signal. On the ensuing clock cycle, the flip-flop 307 is reset. In this manner, the counter is held in the present state after a refresh request signal 114, until the refresh sequence begins.

Generation of the start refresh signal 110 is beyond the scope of the present invention other than to explain that the start refresh signal 110 indicates the start of a refresh sequence. Assertion of the start refresh signal 110 is dependent on whether the DRAM module can begin a refresh sequence. For example, if the DRAM module is currently performing a READ or WRITE access, the refresh sequence might not actually begin until the READ or WRITE access is completed. Due to the importance of DRAM refresh, the refresh sequence in DRAM modules is given priority over READ and WRITE accesses.

The present invention merely detects the occurrence of the refresh sequence start as indicated by the assertion of the start refresh signal 110. Note that the start refresh signal 110 has to be asserted within a refresh interval defined by the programmable register 202. The present invention considers it an error condition for the start refresh signal 110 to be asserted more than a refresh interval after the refresh request signal 114.

Figure 4:
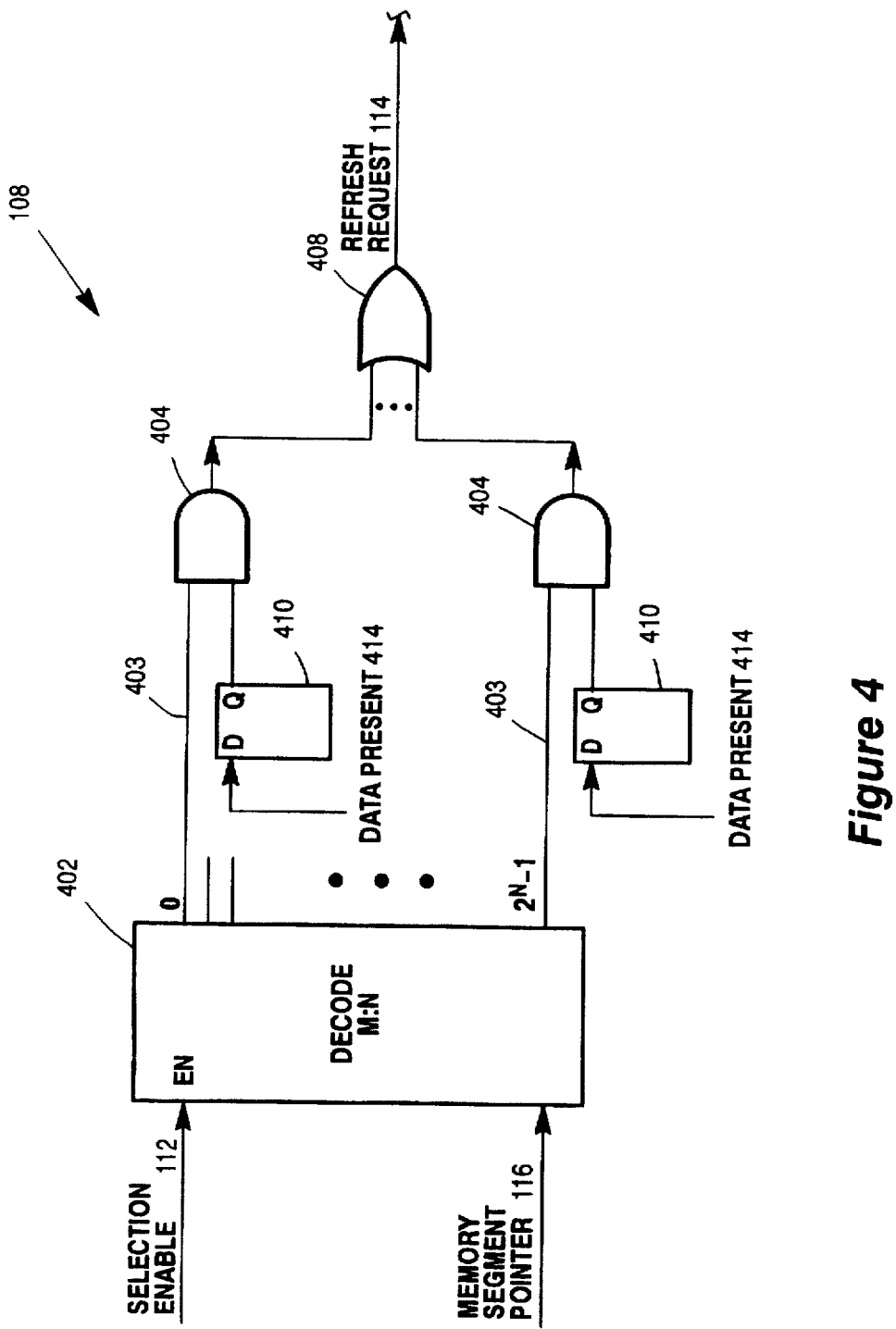
FIG. 4 is a refresh request generator according to a preferred embodiment.

FIG. 4 illustrates a refresh request generator 108 according to the preferred embodiment of the present invention. Referring to FIG. 4, the refresh request generator 108 includes an M:N decoder 402. Each of the N outputs 403 of the M:N decoder 402 is coupled to a 2-input AND gate 404. The other input of each AND gate 404 is the state of a flip-flop 410. The outputs of each of the AND gates 404 are input to an N-input OR-function 408. The OR-function 408 asserts a refresh request signal 114 if any of the AND gates 404 are asserted. The refresh request generator 108 inputs the selection enable signal 112 generated by the refresh interval generator 104, the memory segment pointer 116 generated by the memory segment pointer generator 106, 414 (described below), and a data present signal from other components in the memory subsystem. The refresh request generator 108 outputs a refresh request signal 114.

The M:N decoder 402 inputs the selection enable signal 112 to enable the outputs 403 of the decoder. The selection enable signal 112 enables the decoder 402 to output a signal on one of its outputs 403. If the selection enable signal 112 is not asserted, none of the outputs of the decoder 112 are asserted. Therefore, the refresh request generator signal 114 can only be generated when the selection enable signal 112 has been asserted, that is, at the end of a refresh interval. The M:N decoder also inputs the memory segment pointer 116. The M:N decoder asserts the output 403 corresponding to the memory segment pointer 116. Thus, if the memory segment pointer value is six, the M:N decoder asserts the sixth output line.

Each of the outputs 403 of the M:N decoder is coupled to an AND gate 404. The other input to each AND gate 404 is the state of a flip-flip 410. There is a unique flip-flip 410 for each output 403 of the M:N decoder 402. Each of the flip-flops 410 indicates whether there is data present in the corresponding segment. Data is present in the corresponding memory segment if there is a DRAM module in the memory segment and both the memory segment and the DRAM module are operable. This condition of the DRAM segment is hereinafter referred to as an 'active' segment. Alternatively, in another embodiment of the present invention, an active memory segment is defined as a memory segment which is populated by a memory module, regardless of whether the memory module is operable.

The flip-flops are configured according to unique data present signals 414. As stated the data present signals 414 correspond to whether data is present in the memory segment. Generation of the data present signals 414 is beyond the scope of the present invention. As stated the data present signal indicates that a memory segment is active. In one embodiment of the present invention, the computer system can render a populated segment inactive upon the determination of a memory failure or the like. A data present signal 414 will not be generated for an inactive memory segment.

Because the decoder 402 only asserts a single output (the output 403 corresponding to the memory segment pointer 116 input), assertion of the refresh request signal 114 by the OR-function 408 must be for the memory segment pointed to by the memory segment pointer 116. However, no signal is output by any of the AND gates 404 unless the line is activated and there is data present. Assertion of the request refresh signal 114 by the OR-function 408, therefore, indicates that the memory segment pointed to by the memory segment pointer 116 is working, and that it is populated by a working DRAM module. The assertion of the request refresh signal 114 requests refresh of the memory segment pointed to by the memory segment pointer 116.

The data present signal 414 eliminates the need as in conventional systems, to pre-determine which memory segments are populated, tagging those segments to be skipped and altering the refresh interval based on the number of populated segments, as previously described. Conversely, because the present invention does not generate a refresh request signal for segments that have no data present according to the data present signal 414, each segment is treated in the same manner. That is, no logic is required skip unpopulated memory segments. Thus, each memory segment is addressed by the present invention, but refresh requests are generated only for those memory segments that are active.

Figure 5:
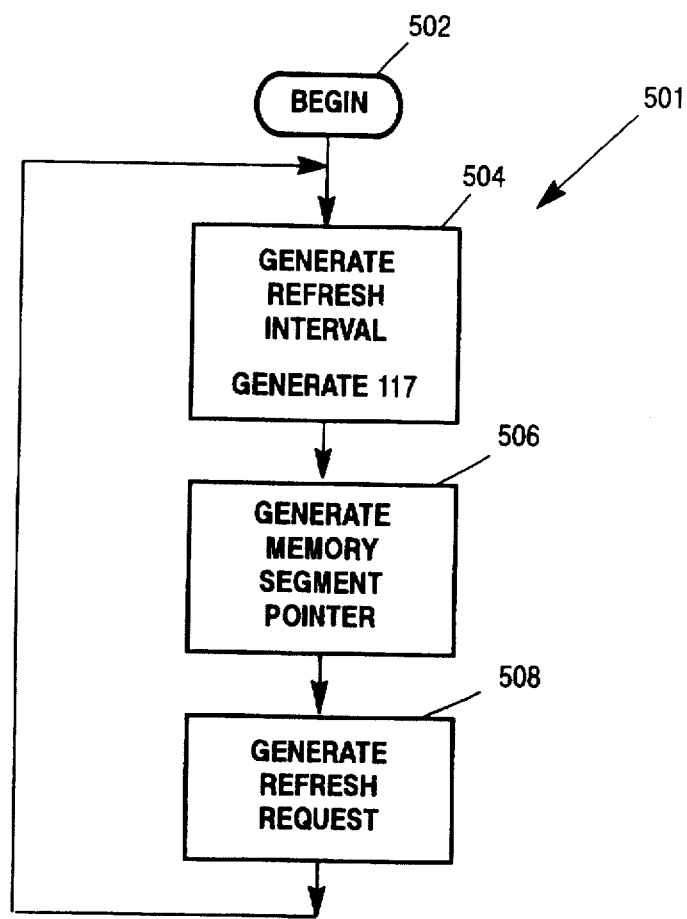
FIG. 5 is a flowchart for a method according to a preferred embodiment of the present invention.

FIG. 5 is a flow chart for a method 501 according to the preferred embodiment of the present invention. The method 501 generates an indicator that a time representing a refresh interval has elapsed. Upon indication that the refresh interval has elapsed, the method 501 refreshes a DRAM module, if such DRAM module is present, in the memory segment pointed to by the memory segment pointer. The method 501 can be executed using the configuration illustrated in FIG. 1.

Referring to FIG. 5, the method 501 performs three steps: generating a refresh interval in step 504, generating a memory segment pointer in step 506, and generating a refresh request in step 508. The method 501 begins in step 502 whereupon it immediately executes step 504. In step 504, the method 501 generates a refresh interval. The refresh interval, when summed over all memory segments, is the amount of time between successive refresh sequences for a particular DRAM module. The method 501 calculates the interval using Equation (1). Step 504 generates a selection enable signal 117 (112 in FIGS. 2 to 4) when the refresh interval time has elapsed. When the selection enable signal 117 has been generated, the method 501 executes step 506. In step 506, the method 501 generates a memory segment pointer 116. In the preferred embodiment, the memory segment pointer 116 is the count value in a counter. The counter increments if certain conditions are satisfied. The conditions are described above, as well as with reference to FIG. 7. The method 501 then executes step 508. In step 508, the method 501 uses the memory segment pointer to generate a refresh request for the particular memory segment pointed to by the memory segment pointer 116. After generating the refresh request the method 501 returns to step 504 to await generation of the next selection enable signal 117.

Figure 6:
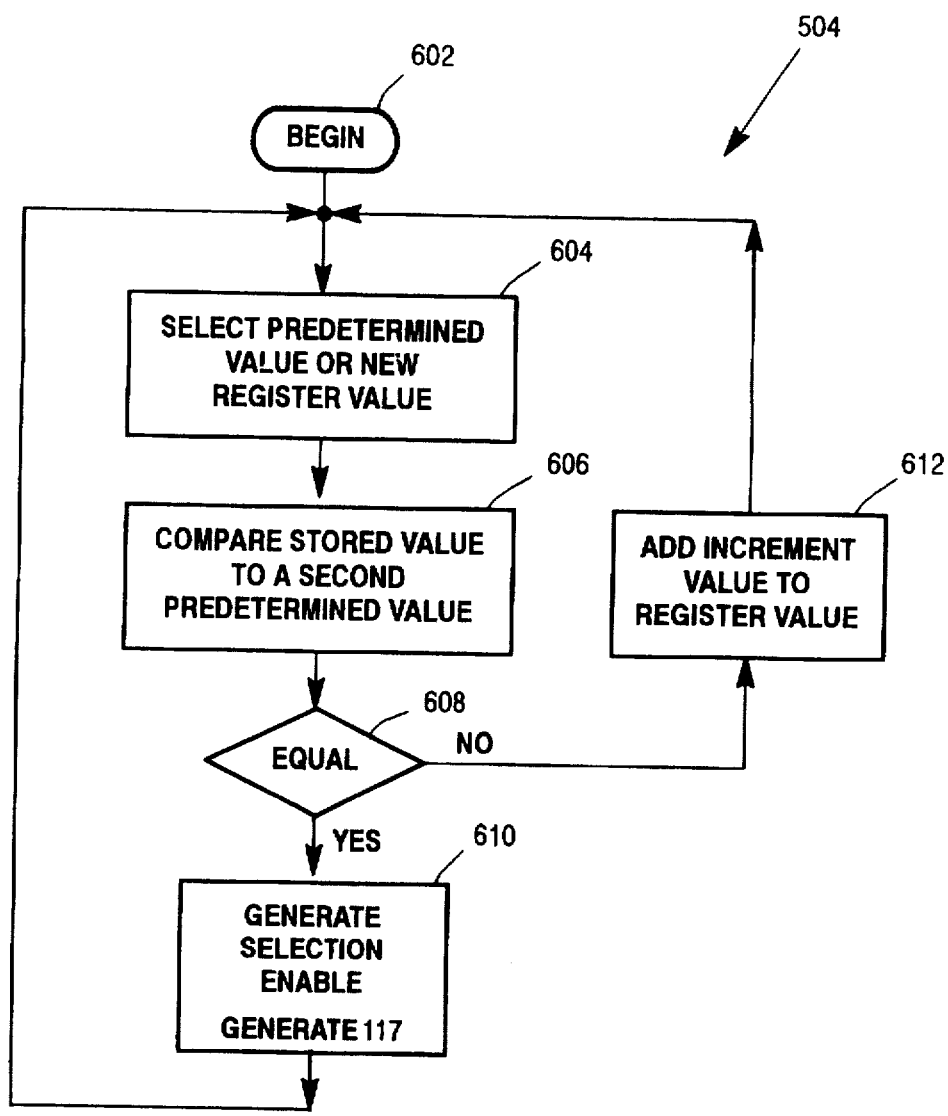
FIG. 6 is a flowchart for generating a refresh interval.

FIG. 6 is a flowchart for executing step 504. Step 504 compares a stored value in a register to a predetermined value. If the comparison indicates that the quantities are equal, then step 504 generates a selection enable signal. Generation of the selection enable signal indicates that the refresh time interval has elapsed.

Referring to FIG. 6, the method step 504 begins in step 602, whereupon the method step 504 immediately executes step 604. In step 604, method step 506 stores a predetermined value in a register. The value is zero where the register counts up. The value is the value calculated according to Equation (1) where the register counts down. The method step 506 continues in step 606. In step 606, the method step 504 compares the predetermined value to a second predetermined value. The second predetermined value is 0 where the register counts down. The second predetermined value is the value calculated according to Equation (1) when the register counts up. The method step 506 continues in step 608. In step 608, the method step 506 determines whether the register value equals the second predetermined value.

If the value stored in the register in step 604 equals the second predetermined value, the method step 506 generates a selection enable signal 117 in step 610. The method step 506 then continues in step 604. In this case, the method selects the stored predetermined value, thereby resetting the refresh interval counter.

If on the other hand, the value stored in the register in step 604 does not equal the second predetermined value, the method step 506 continues in step 612. In step 612, the method step 506 increments the value in the register by adding a quantity (increment value) to the value in the register. In the preferred embodiment, the quantity is a positive one when the register counts up, and a negative one when the registers counts down. After incrementing the register value, the method step 506 continues in step 604. In this case, the method step 506 loads the register with the incremented register value. The addition continues the count for the duration of the refresh interval.

Figure 7:
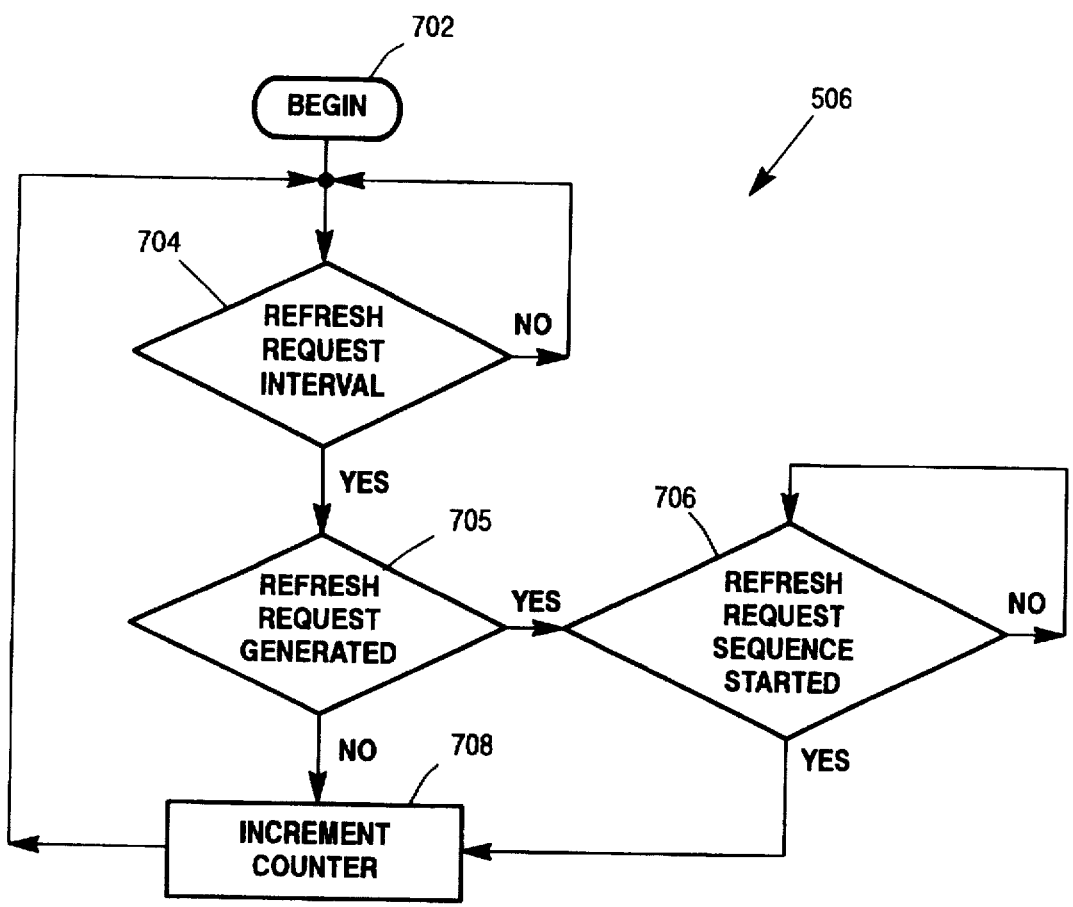
FIG. 7 is a flowchart for generating a memory segment pointer.

FIG. 7 is a flowchart for executing step 506. Step 506 generates the memory segment pointer 116. In the preferred embodiment, the memory segment pointer 116 is the current value of a modulo-N counter, where N is the number of memory segments supported by a particular memory board. Step 506 increments the counter, i.e., points to the next memory segment when (1) no refresh request signal is generated and the refresh interval time has elapsed, or (2) a refresh request signal is generated and the refresh sequence associated with the refresh request signal has started. The first condition indicates that there is no DRAM present in the memory segment referenced by the memory segment pointer 116. The second condition indicates that a refresh sequence has started prior to incrementing the counter. The second condition avoids refreshing the next memory segment, where the memory segment pointer advances prior to the start of the refresh sequence.

Referring to FIG. 7, method step 506 begins in step 702 whereupon it immediately executes step 704. In step 704, the method step 506 determines whether a refresh request interval has elapsed. In the preferred embodiment, the method step 506 determines if step 504 issued a selection enable signal 117. If the refresh request interval has not elapsed, the method step 506 continues in step 704, and waits for the refresh interval time to pass.

If the refresh interval time has elapsed, the method step 506 continues in step 705. In step 705, the method step 506 determines whether a refresh request has been generated. In the preferred embodiment, the method step 506 determines whether step 508 (described below) asserted the refresh request signal 114.

If the refresh request signal 114 was generated, the method step 506 proceeds to step 706. The method step 506 waits in step 706 for an indication that the refresh sequence has started. After the refresh sequence has started, the method increments the counter in step 708. The method step 506 then proceeds to step 704 to await the end of the next refresh interval.

If the refresh request signal was not generated, then the memory segment to which the memory segment pointer 116 pointed was not populated. As a result, no DRAM refresh need be performed. In this case, the method step 506 proceeds in step 708 and increments the counter. The method step 506 then continues in step 704 to await the end of the next refresh interval.

Figure 8:
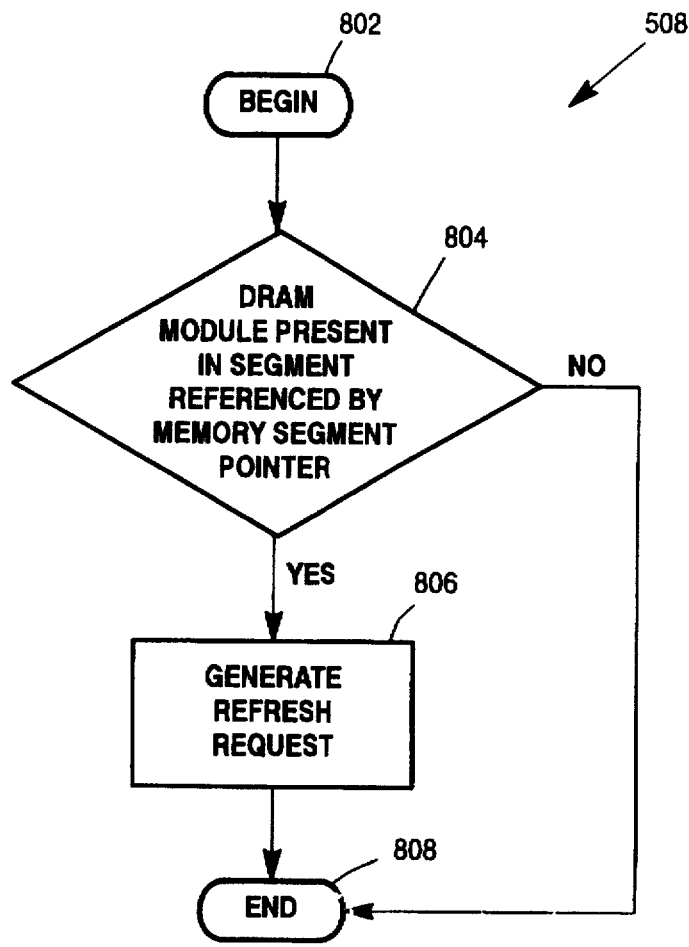
FIG. 8 is a flowchart for generating a refresh request signal.

FIG. 8 is a flowchart for executing step 508. Step 508 generates the refresh request signal 114. Step 508 only generates a refresh request signal at the end of a refresh interval. The end of the refresh interval is indicated by the assertion of the selection enable signal 117 issued by step 504. However, step 508 does not generate a refresh request signal 114 if there is no DRAM module present in the memory segment pointed to by the memory pointer 116.

Referring to FIG. 8, method step 508 begins in step 802 whereupon it immediately executes step 804. In step 804, the method step 508 determines if a DRAM module populates the memory segment pointed to by the memory segment pointer 804. If the particular memory segment is populated, the method step 508 proceeds in step 806. In step 806, the method step 508 generates a refresh request signal 114 for the memory segment referenced by the memory segment pointer 116. Using this information and the memory segment referenced by the memory segment pointer 116, the present invention initiates a refresh sequence for the particular referenced memory segment. The method step the terminates in step 808. If, on the other hand, no DRAM module populates the particular memory segment, the method step 508 terminates in step 808.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An apparatus for refreshing each of a plurality of memory modules that populate some or all of the memory segments on a memory board, said apparatus comprising:

a programmable refresh interval generator for generating a periodic signal coupled to a memory segment that is to have a memory module populating said memory segment refreshed;

a memory segment pointer generator coupled to said refresh interval generator for selecting, in a predetermined order, one of a plurality of said memory segments; and a refresh request generator responsive to an output of said memory segment pointer generator and of said refresh interval generator for generating a refresh request signal for refreshing memory modules that populate said selected memory segment;

said refresh request generator comprising means for enabling said refresh request signal for said select ed memory segment if said selected memory segment is populated with a memory module; and said memory segment pointer generator further comprising means for inhibiting, when said refresh request signal has been generated, the selection of a next one of said memory segments until a requested refresh sequence has begun.

2. The apparatus as recited in claim 1, wherein said programmable refresh interval generator comprises:

a programmable register to store a first predetermined value substantially corresponding to said memory module's maximum refresh interval, system clock period and the number of memory segments supported by the memory board;

a count register coupled to said programmable register having a register count value;

an adder to add an increment value to said register count value thereby producing a new register count;

selection means coupled to said programmable register and to said adder to select for input to said count register either said first predetermined value or said new register count value; and a comparator coupled to said count register to generate said periodic signal when said register count value equals a second predetermined value.

3. The apparatus as recited in claim 2, wherein said increment value is negative one and said second predetermined value is zero.

4. The apparatus as recited in claim 2, wherein said increment value is one and said second predetermined value substantially represents a maximum refresh interval of said memory module, a system clock period, and the number of memory segments supported by the memory board.

5. The apparatus as recited in claim 1, wherein said memory segment pointer generator further comprises:

a counter to indicate which of said plurality of memory segments is selected, said counter being configured to reset when all memory segments have been selected; and control logic to increment said counter if one of the following conditions is satisfied:
  (a) said refresh request generator does not generate a refresh request signal and said refresh interval generator indicates that said interval has elapsed, and
  (b) said refresh request generator generates a refresh request signal and a refresh sequence associated with said refresh request signal has begun execution.

6. The apparatus of claim 5, wherein said counter is a modulo-N counter where N is equal to the number of memory segments supported by the memory board.

7. The apparatus of claim 1, wherein said refresh request generator comprises:

a selection circuit responsive to an output of said refresh interval generator, said output of said refresh interval generator permitting the selection process to occur, and to an output of said memory segment pointer generator, said output of said memory segment pointer generator causing said selection circuit to select a particular memory segment;

indication means for indicating whether a memory module is active in said particular memory segment; and generation means for generating a refresh request signal when said indication means indicates a memory module is in said particular memory segment.

8. A method for refreshing memory modules which populate some or sell of the memory segments on a memory board, said memory board clocked by a system clock having a system clock cycle time, comprising the steps of:

(a) generating a refresh interval for each of the segments on said memory board, the elapse of said refresh interval being indicated by a selection enable signal;

(b) generating a memory segment pointer in response to said selection enable signals;

(c) generating a refresh request signal for the memory segment corresponding to the count in a counter in response to said selection enable signal and said memory segment pointer if a memory module is present in the memory segment.

9. The method recited in claim 8, wherein step (a) comprises the steps of:

(1) selecting one of a register value and a predetermined value stored in a programmable register as a selected value;

(2) comparing said selected value to a second predetermined value;

(3) determining whether said selected value equals said predetermined value; and (4) if said determining step indicates inequality, then adding a quantity to said register value and repeating step (1) through step (4), else if said determining step indicates equality, then asserting a selection enable signal to indicate that a refresh interval has elapsed.

10. The method as recited in claim 9, wherein said adding step comprises the step of adding negative one to said register value, said comparing step comprises comparing to zero as said second predetermined value.

11. The method as recited in claim 9, wherein said adding step comprises the step of adding one to said register value, and said comparing step comprises comparing to a value substantially corresponding to the maximum refresh interval of the memory modules, the system clock period, and the number of memory segments on the memory board as said second predetermined value.

12. The method as recited in claim 8, wherein step (c) further comprises the steps of:

determining to which memory segment said count value corresponds; and generating a refresh request if a DRAM module is present for said memory segment to which said count register value corresponds.

13. The method as recited in claim 8, wherein step (b) comprises the steps of:

incrementing a counter, the count value corresponding to one of the memory segments on the memory board, if one of the following conditions is satisfied:

(1) said refresh request generator does not generate a refresh request and said programmable refresh generator indicates that said interval has elapsed, and (2) said refresh request generator generates a refresh request and a refresh sequence associated with said refresh request has begun execution; and generating said memory segment pointer in correspondence with said count value.

14. The method as recited in claim 13 wherein step (c) comprises the step of:

generating a refresh request for the memory segment corresponding to said count value in said counter at the end of said refresh interval if a memory module is active in the memory segment.

15. The method as recited in claim 8, further comprising the step of (d) repeating step (a) through step (d).

* * * * *